United States Patent [19]

Nadeau-Dostie et al.

[11] Patent Number: 6,000,051
[45] Date of Patent: Dec. 7, 1999

[54] METHOD AND APPARATUS FOR HIGH-SPEED INTERCONNECT TESTING

[75] Inventors: Benoit Nadeau-Dostie; Jean-Francois Côté, both of Aylmer, Canada

[73] Assignee: Logic Vision, Inc., San Jose, Calif.

[21] Appl. No.: 08/948,842

[22] Filed: Oct. 10, 1997

[51] Int. Cl.$^6$ .................................................. G01R 31/28
[52] U.S. Cl. .......................... 714/727; 714/731; 327/144
[58] Field of Search .................................. 714/731, 727, 714/726, 724, 729, 733, 734, 814, 815, 30; 327/144, 141; 377/77, 78, 81

[56] References Cited

U.S. PATENT DOCUMENTS

| | | | |
|---|---|---|---|
| 4,494,066 | 1/1985 | Goel et al. ............................... | 714/726 |
| 5,109,190 | 4/1992 | Sakashita et al. ....................... | 714/727 |
| 5,463,338 | 10/1995 | Yurash .................................... | 327/202 |
| 5,774,476 | 6/1998 | Pressly et al. ........................... | 714/726 |

OTHER PUBLICATIONS

Y. Zorian et al., "An Effective Multi–Chip BIST Scheme", Journal of Electronic Testing: Theory and Applications 10, (1997), pp. 87–95.

T.M. Storey et al., "A Test Methodology for High Performance MCMs", Journal of Electronic Testing: Theory and Applications 10, (1977), pp. 109–118.

C. Maunder et al., "Boundary–Scan, A framework for structured design–for–test", IEEE 1987 International Test Conference, Paper 30.1, (1987), pp. 714–723.

*IEEE Standard Test Access Port and Boundary–Scan Architecture*, IEEE Standard 1149.1–1990 (Includes IEEE Standard 1149.1a–1993) pp. 1–1 to 1–5; 5–1 to 5–16.

*Primary Examiner*—Trinh L. Tu
*Attorney, Agent, or Firm*—Skjerven, Morrill, MacPherson, Franklin & Friel LLP; Norman R. Klivans

[57] ABSTRACT

A method of testing high speed interconnectivity of circuit boards having components operable at a high speed system clock, employing an IEEE 1149.1 standard test method in which test data is shifted into and from the components at the rate of a test clock during Shift_In and Shift_Out operations, and having an Update operation and a Capture operation between the Shift_In and Shift_Out operations, the components including a first group of components capable of performing the Update and Capture operations at the rate of the Test Clock only and a second group of components capable of performing the Update and Capture operations at the rate of the system clock, the method comprising the steps of performing the Shift_In operation in all of the components concurrently at the rate of the Test Clock; performing the Update and Capture Operations in the first group of components at the rate of the Test Clock; and performing the Update and Capture Operations in the second group of components at the rate of the system Clock. The method employs a novel integrated circuit, test controller and boundary scan cells.

43 Claims, 8 Drawing Sheets

Note: The Values adjacent to each state transition corresponds to *TMS*.
DR_STATES =SHIFT_DR, EXIT1_DR, PAUSE_DR, EXIT2_DR, UPDATE_DR
OPDECODE= 1 when test register selected

METHOD AND APPARATUS FOR HIGH-SPEED INTERCONNECT TESTING

The present invention relates in general to interconnect testing of multi-device electrical circuit boards operating under different time domains, using Test Access Ports, built-in self-test controllers and low speed test equipment and, more specifically, to a novel method for high-speed interconnect testing using standard test equipment and to novel integrated circuits and components used therewith.

BACKGROUND OF THE INVENTION

Printed circuits are becoming increasingly more complex and inaccessible for traditional testing methods such as, for example, test clips, probes and bed-of-nails fixtures. Increased degrees of miniaturization has reduced accessibility for testing and has necessitated development of methods for internal and boundary scan architecture. IEEE has specified voluntary standards for low speed internal and boundary testing to address this problem. The standard allows customers to purchase chips from various manufacturers and find them all to be compatible.

The IEEE standard defines test logic that can be included in an integrated circuit to provide standardized approaches to testing the interconnections between integrated circuits once they have been assembled onto a printed circuit board or other substrate; testing the integrated circuit itself; and observing or modifying circuit activity during the component's normal operation at a test speed.

The test logic consists of a boundary scan register and other building blocks accessed through a Test Access Port (TAP). The circuitry defined by the standard allows test instructions and associated test data to be fed into a component and, subsequently, allows the results of execution of such instructions to be read out. All information (instructions, test data, and test results) is communicated in a serial format. The sequence of operations can be controlled by a bus master, which can be either an automatic test equipment (ATE) or a component that interfaces to a higher-level test bus as a part of a complete system maintenance architecture. Control is achieved through signals applied to Test Mode Select (TMS) and Test Clock (TCK) inputs of the various components connected to the bus master. Starting from an initial state in which the test circuitry defined by this standard is inactive, a typical sequence of operations would be as follows:

The first step would be, in general, to load serially into the component, the instruction code for a particular operation to be performed. The test logic defined by the standard is designed such that the serial movement of instruction information is not apparent to those circuit blocks whose operation is controlled by the instruction. The instruction applied to these blocks changes only on completion of the shifting (instruction load) process.

Once the instruction has been loaded, the selected test circuitry is configured to respond. In some cases, however, it is necessary to load data into the selected test circuitry before a meaningful response can be made. Such data are loaded into the component serially in a manner analogous to the process used previously to load the instruction. The movement of test data has no effect on the instruction present in the test circuitry.

The test instruction is executed and then, based where necessary on supplied data, the results of the test can be examined by shifting data out of the component to or through the bus master. In cases where the same test operation is to be repeated but with different data, new test data can be shifted into the component while the test results are shifted out. There is no need for the instruction to be reloaded.

Operation of the test circuitry may proceed by loading and executing several further instructions in a manner similar to that described above and or conclude by returning the test circuitry and, where required, on-chip system circuitry, to its initial state.

Storey and McWilliam ("A test methodology for high performance MCMs", Thomas M. Storey, Bruce McWilliam, Journal of Electronic Testing: Theory and Applications, vol. 10, pp 109–118, 1997) show how to test interconnect and glue logic between integrated circuits using a specific boundary scan technique (i.e. LSSD-Level Sensitive Scan Design). This technique allows testing of delay faults and has good diagnostic resolution. The problems with this method are: 1) it is incompatible with the IEEE 1149.1 standard which is the most commonly accepted test architecture in the industry. Therefore, even for low speed testing, non-standard test methodology and equipment are required; 2) very few components are designed using this clocking methodology; and 3) it is very difficult to augment to support Built-In Self-Test at the board level.

Zorian and Bederr ("An Effective Multi-Chip BIST Scheme", Yervant Zorian, Hakim Bederr, Journal of Electronic Testing: Theory and Applications, vol. 10, pp 87–95, 1997) teach us how to test interconnect only at high-speed. However 1) their solution cannot handle glue logic at all; 2) the diagnostic resolution is not sufficient (output data is compacted at the outputs of the various chips—for instance if the signature collected in the ODC-IO of a chip is good and the signature of ODC-IO of the following chip is bad, then one can conclude that the fault is in the interconnects between the chips, and not in the chips). It only allows one to determine that at least one signal was too slow in a bus (group) of signals; 3) the timing of enable signals cannot be tested because fixed configurations are used; and 4) multi-cycle paths are not supported (i.e. signals must propagate from one integrated circuit to the other within a single clock cycle of the high speed system clock). This is not always acceptable; and 5) they acknowledge that the test registers of different integrated circuits must be synchronized, but do not explain how. This is a difficult problem to resolve.

SUMMARY OF THE INVENTION

In accordance with one aspect of the present invention, there is provided a method of testing high speed interconnectivity of circuit boards having components operable at a high speed system clock, the method employing IEEE 1149.1 standard test methods in which test data is shifted into and from the components at the rate of a test clock during Shift__In and Shift__Out operations, and having an update operation and a capture operation between the Shift__In and Shift__Out operations, the improvement comprises executing the update and capture operations at the rate of the system clock.

In accordance with another aspect of the present invention, there is provided a Test Controller for an integrated circuit for high speed interconnectivity testing of components on circuit boards using IEEE 1149.1 standard test method in which test data is shifted into and from the components at the rate of a test clock during Shift__In and Shift__Out operations, and having an update operation and a capture operation between the Shift__In and Shift__Out operations, the circuit be operable at a system clock which is greater than the Test Clock, the test controller comprising means responsive to an Update instruction for producing a FastUpdate instruction and a FastCapture instruction and delivering the FastUpdate and FastCapture instructions in predetermined timed sequence to boundary scans cells in the circuit for executing the Update and Capture operations at the rate of the system clock.

In accordance with still another aspect of the present invention, there is provided an integrated circuit, comprising a core operable at the system clock and having a plurality of connections; boundary scan cells connected to each the connections and arranged in a scan chain interconnecting the connections; a test access port having inputs for receiving a test clock signal, a Test Mode Select signal; Test Data Input for receiving test data thereat; and outputs for Serial Data, an Update instruction and a Capture instruction; a Test Controller responsive to the Update instruction for producing a FastUpdate instruction and a FastCapture instruction and delivering the FastUpdate and FastCapture instructions in predetermined timed sequence to the boundary scans cells for executing Update and Capture operations at the rate of the system clock.

Still another aspect of the present invention provides A boundary scan cell for inputting and/or outputting data to the core of an integrated circuit having a test access port and a test controller and operable at a system clock, the test access port having a data Shift_In state for shifting data into the circuit, a data Shift_Out state for shifting data captured from the core from the circuit, an Update state for effecting an Update operation and a Capture state for effecting a Capture operation, the boundary scan cell comprising means operable at a test clock rate for receiving data during the Shift_In state and outputting data during the Shift_Out state; means operable at the system clock rate and responsive to a FastUpdate signal output by the test controller for performing an Update operation; and means operable at the system clock rate and responsive to a FastCapture signal output by the test controller for performing a Capture operation.

BRIEF DESCRIPTION OF THE DRAWINGS

These and other features of the invention will become more apparent from the following description in which reference is made to the appended drawings in which.

DESCRIPTION OF PREFERRED EMBODIMENTS

Figure 1:
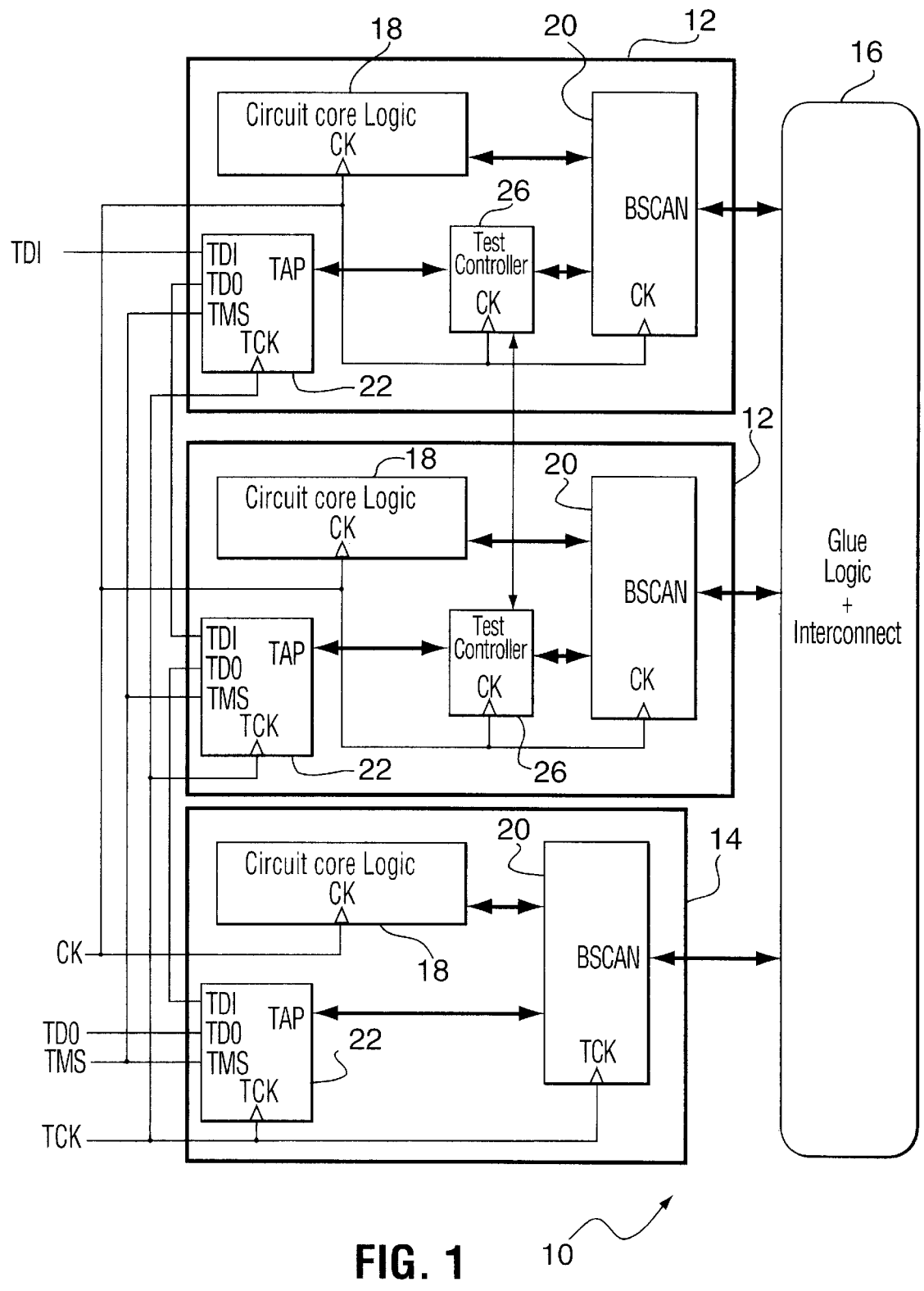
FIG. 1 is a block diagram illustrating a circuit board having two integrated circuits, which are constructed in accordance with the present invention and support the high speed interconnectivity method of the present invention, a standard or conventional integrated circuit and interconnect and glue logic.

FIG. 1 illustrates a circuit board 10 under test having two integrated circuits 12 supporting the high-speed interconnect test method of the present invention and one conventional off-the-shelf IEEE 1149.1 compliant integrated circuit 14. The three integrated circuits are interconnected via glue logic and interconnect 16 in a conventional manner. Glue logic and interconnect 16 generally refers to all of the components on the circuit board that are not compliant with the present invention or the IEEE 1149.1 methodology. This may include electrically conducting tracks, logic gates, output devices (LED's, etc.), selector switches, etc. It will be understood that the circuit board may contain many more components and is not limited to those shown.

Each of the integrated circuits 12 and 14 include a core 18, a boundary scan cell chain 20, shown as a single block in FIG. 1, comprised of individual scan cells, each associated with a particular core connection as well known in the art, and a Test Access Port 22. In addition, integrated circuits 12 include a Test Controller 26 which is described in more detail later.

As shown in FIG. 1, a Test Clock Signal, TCK, generated by automatic test equipment, not shown, is applied to the Test Access Port 22 of each integrated circuit and to Test Controller 26 of integrated circuits 12. A system clock or high speed clock signal, CK also referred to as SysClock later, is applied to core 18 of each of the integrated circuits 12 and 14 and to the Test Controller 26 of integrated circuits 12. While only one system clock is shown in FIG. 1, multiple system clocks can be used, as explained later. The Test Access Ports 22 include a Test Data Input (TDI), a Test Data Output (TDO) and a Test Mode Select input (TMS), all of which are well known in the art.

Figure 2:
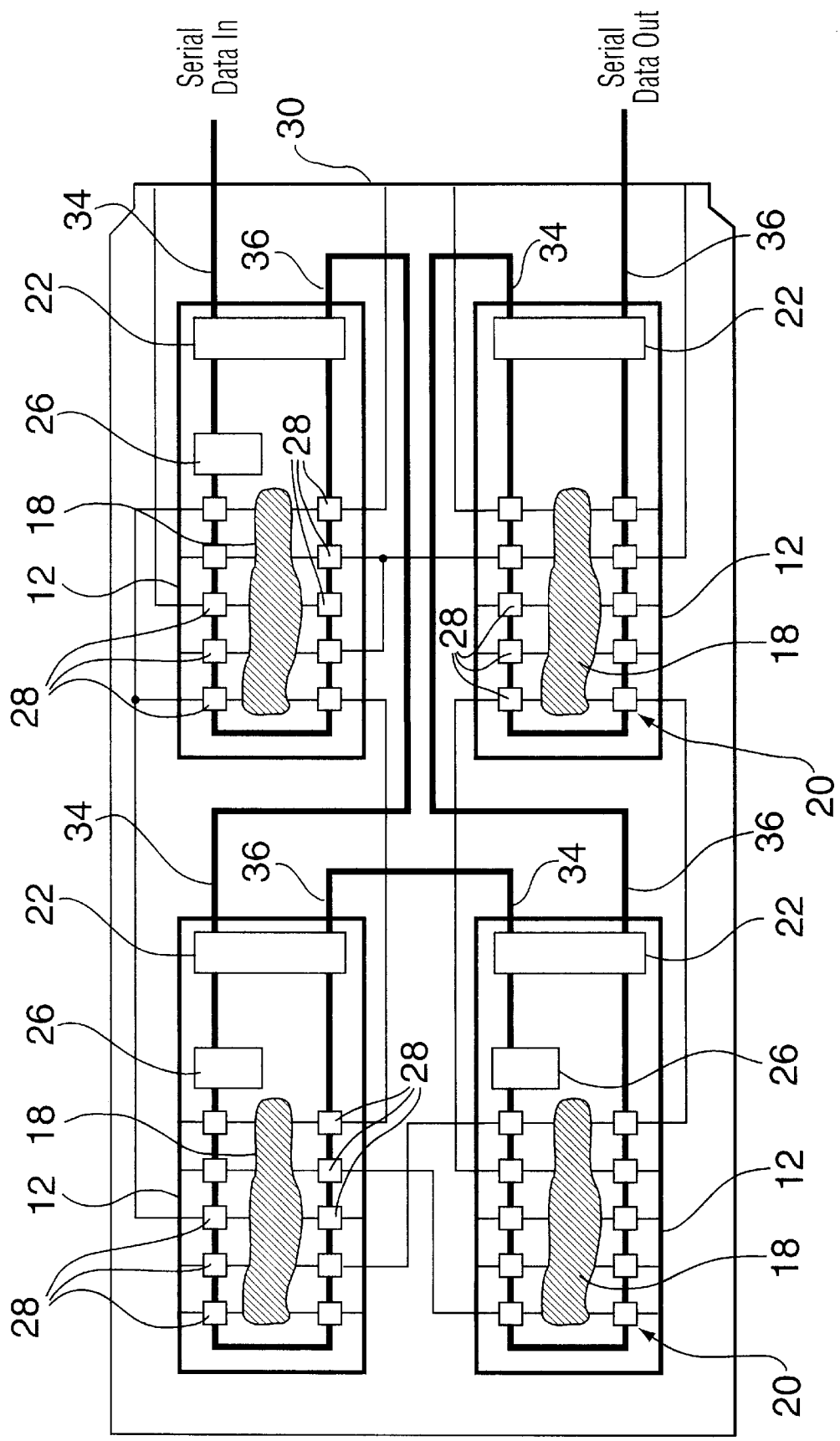
FIG. 2 is similar to FIG. 1, but illustrates the internal components of the integrated circuits in more detail and particularly illustrates the serial interconnection of boundary scan cells to show test data flows serially into and through the cells.

FIG. 2 illustrates the circuit board 10 in more detail than FIG. 1 in order to better illustrate the boundary scan cell chain 20 and the plurality of boundary scan cells 28 associated with the core of each integrated circuit and the serial interconnection of the cells for serial data transfer. Circuit Board 10 is formed with an edge card connector 30 to connect the board to external equipment, including the automatic test equipment. FIG. 2 shows three integrated circuits 12 and one conventional off-the-shelf IEEE 1149.1 compliant integrated circuit 14. As in FIG. 1, the main components of the two types of integrated circuits have been identified—core logic 18, boundary scan cells 28, Test Access Port 22 and Test Controller 26.

Before describing the preferred embodiment of the present invention in more detail, it will be informative to review the standard test methodology, and particularly with reference to the various states of a standard Test Access Port and standard or conventional boundary scan cells.

Prior to performing a test of circuit board 10, the board is electrically connected to external automatic test equipment (ATE) via the edge card connector 30 and test data is loaded into each of the boundary scan cells. The ATE transmits predetermined test data serially to the serial input of the edge card connector 30, which is electrically connected to the TDI input 34 of the first integrated circuit. From the TDI input 34, the test data is latched serially through the Test Access Port 22 at the rate of the test clock. The test data is then serially latched through each of the boundary scan cells 28 in each integrated circuit, also at the rate of the test clock, and back to the Test Access Port 22. The Test Access Port passes the data serially out through output TDO 36, where it passes on to the TDI 34 input of the next integrated circuit. This process continues until the desired test data has been loaded, at the test clock rate, into all of the boundary scan cells. The test is then run. Upon completion of the test, the data in the boundary scan cells 28, is serially unloaded to the ATE via the serial output of the edge card connector 30. It is important to note at this point that the process thus far described is identical to and fully compliant with the IEEE standard test. It will be shown later how the present invention is able to perform high speed interconnectivity testing while executing the standard IEEE standard test. Before doing so, the operation of a standard Test Access Port will be briefly described.

Figure 3:
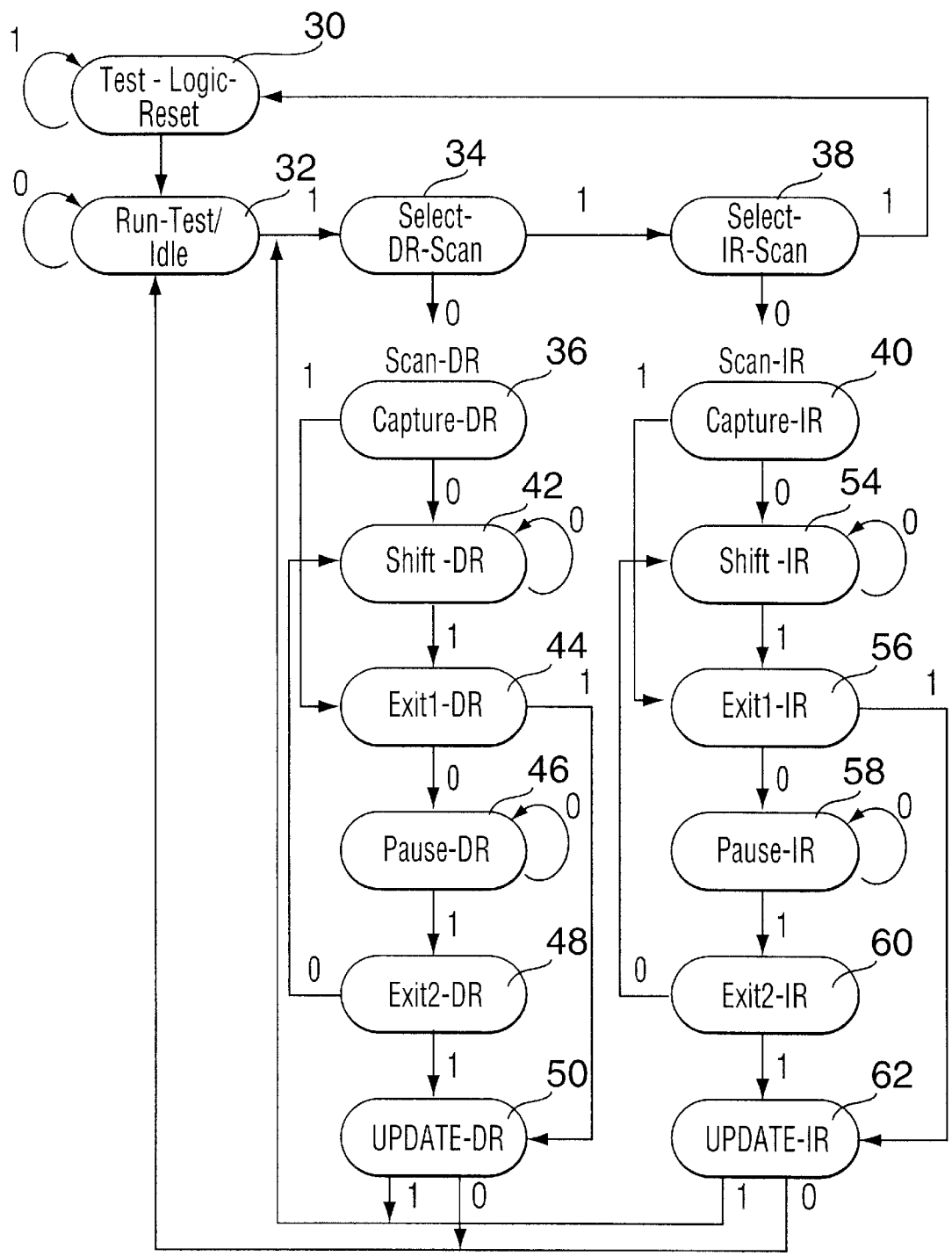
FIG. 3 is a state diagram for a standard Test Access Port.

FIG. 3 illustrates a state diagram for the Test Access Port 22. The values adjacent to each state transition correspond with the data synchronously input to Test Access Port 22 via the Test Mode Select TMS input from the external test equipment at the low speed test clock. For example, if the Test Access Port is in the Exit1_DR 52 state and TMS is high when the next test clock cycle is received, the Test Access Port moves into the Update_DR 50 state; while if TMS is low, the Test Access Port moves into the Pause_DR 54 state. To initialize the Test Access Port, TMS is held high for a series of test clock cycles. Regardless of the state of the Test Access Port at startup, holding TMS high will return the Test Access Port to the Test_Logic_Reset 40 state.

The detailed operation of the Test Access Port 22 is well known in the art and will not be repeated here, beyond the requirements of describing the operation of the invention. The important points to note are:

First, the Test Access Port states include three basic actions required for testing: stimulus application (Update_DR state 50), execution (Run_Test/idle state 40), and response capture (Capture$_{13}$ DR state 48).

Second, when using an IEEE 1149.1 compliant Test Access Port, there are times at which the serial data stream is interrupted, during the states Exit1_DR 44, Pause_DR 46, Exit2_DR 48, Update_DR 50. Since there is no new serial data to shift into the Boundary Scan Cell test registers during those states, the test registers should not be clocked. In the case of synchronous boundary scan cells, the test registers are controlled by the free running system clock, and therefore additional controls are required. The Shift_DR 42 state is one of several states that cause the test registers to hold their data, because the system clock frequency is higher than that of the Test Access Port. The test register should only shift by one position for each clock cycle of the Test Access Port during the Shift_DR state 42, and otherwise hold the current data value. The synchronization of these control states with the system clock is handled by Test Controller 26.

Referring to FIG. 3, the Test-Logic-Reset state 30 is one in which the test logic is disabled so that normal operation of the on-chip system logic, i.e., in response to stimuli received through the system connections only, can continue unhindered. This is achieved by initializing the instruction register to contain an IDCODE instruction or, if the optional device identification register is not provided, a BYPASS instruction. No matter what the original state of the Test Access Port, it will enter the Test_Logic/Reset state when TMS is held high for at least five rising edges of TCK. Test Access Port 22 remains in this state while TMS is high. Test Access Port 22 is forced to the Test-Logic-Reset state 30 at power-up.

The Run_Test/Idle state 32 is a state between scan operations. Once entered, the Test Access Port will remain in this state as long as TMS is held low. In this state, activity in selected test logic occurs only when certain instructions are present. For example, a RUNBIST instruction causes a self-test of the on-chip system logic to execute. Self-tests selected by instructions other than RUNBIST may also be designed to execute while the Test Access Port is in this state. For instructions that do not cause functions to execute in the Run_Test/Idle state, all test registers selected by the current instruction retain their previous state (i.e. Idle). The instruction does not change while the Test Access Port 22 is in this state.

The Select_DR_Scan state 34 is a temporary state in which all test registers selected by the current instruction retain their previous state. If TMS is held low and a rising edge is applied to TCK when the Test Access Port is in this state, the Test Access Port moves into the Capture_DR state 36 and a scan sequence for the selected test register is initiated. If TMS is held high and a rising edge is applied to TCK, the Test Access Port moves on to the Select_IR_Scan state 38. The instruction does not change while Test Access Port 22 is in this state.

The Select_IR_Scan state 38 a temporary state in which all test registers selected by the current instruction retain their previous state. If TMS is held low and a rising edge is applied to TCK when the Test Access Port is in this state, the Test Access Port moves into the Capture-IR state 40 and a scan sequence for the instruction register is initiated. If TMS is held high and a rising edge is applied to TCK, the Test Access Port returns to the Test_Logic/Reset state 30.

The Capture_DR state 36 is a state in which data may be parallel-loaded into test registers selected by the current instruction on the rising edge of TCK. If a test register selected by the current instruction does not have a parallel input, or if capturing is not required for the selected test, then the register retains its previous state unchanged. The instruction, called a Capture signal in the description, does not change while the Test Access Port 22 is in this state.

The Shift_DR state 42 is a state in which test registers connected between TDI and TDO as a result of the current instruction shift data one stage towards its serial output on each rising edge of TCK. Test registers that are selected by the current instruction, but are not placed in the serial path, retain their previous state unchanged. The instruction does not change while Test Access Port 22 is in this state.

The Exit1_DR 44 state is a temporary state in which all test registers selected by the current instruction retain their previous state unchanged. The instruction does not change while Test Access Port 22 is in this state.

The Pause_DR state 46 is a state which allows shifting of test registers in the serial path between TDI and TDO to be temporarily halted. All test registers selected by the current instruction retain their previous state unchanged. The instruction does not change while Test Access Port 22 is in this state.

Exit2_DR state 48 is a temporary state in which all test registers selected by the current instruction retain their previous state unchanged. The instruction does not change while Test Access Port 22 is in this state. Some test registers may be provided with a latched parallel output to prevent changes at the parallel output while data is shifted in the associated shift-register path in response to certain instructions (e.g., EXTEST, INTEST, and RUNBIST). Data is latched onto the parallel output of these test registers from the shift-register path on the falling edge of TCK in the Update_state 50. The data held at the latched parallel output should not change other than in this state unless operation during the execution of a self-test is required, e.g., during the Run_Test/Idle state 32 in response to a design-specific instruction. All shift-register stages in test registers selected by the current instruction retain their previous state unchanged. The instruction does not change while Test Access Port 22 is in this state.

The Capture_IR state 40 is a state in which the shift-register contained in the instruction register loads a pattern of fixed logic values on the rising edge of TCK. In addition, design-specific data may be loaded into shift-register stages that are not required to be set to fixed values. Test registers selected by the current instruction retain their previous state. The instruction does not change while Test Access Port 22 is in this state.

In the Shift_IR state 54, the shift register contained in the instruction register is connected between TDI and TDO and shifts data one stage towards its serial output on each rising edge of TCK. Test registers selected by the current instruction retain their previous state. The instruction does not change while Test Access Port 22 is in this state.

The Exit1_IR state 56 is a temporary state in which test registers selected by the current instruction retain their previous state. The instruction does not change while Test Access Port 22 is in this state and the instruction register retains its state.

The Pause_IR state 58 is a state which allows shifting of the instruction register to be halted temporarily. Test registers selected by the current instruction retain their previous state. The instruction does not change while Test Access Port 22 is in this state and the instruction register retains its state.

The Exit2_IR state 60 is a temporary state in which test registers selected by the current instruction retain their previous state. The instruction does not change while Test Access Port 22 is in this state and the instruction register retains its state.

In the Update_IR 62 state, the instruction shifted into the instruction register is latched onto the parallel output from the shift-register path on the falling edge of TCK in this state. Once the new instruction has been latched, it becomes the current instruction. Test registers selected by the current instruction retain their previous state.

The Pause_DR state 46 and Pause_IR state 58 are included so that shifting of data through the test data or instruction register can be temporarily halted. This might be necessary in order to allow an Automatic Test Equipment system to reload its connection memory from disc during application of a long test sequence. Boundary scan test sequences are likely to extend to the order of $10^7$ test patterns for complex board designs.

Figure 4:
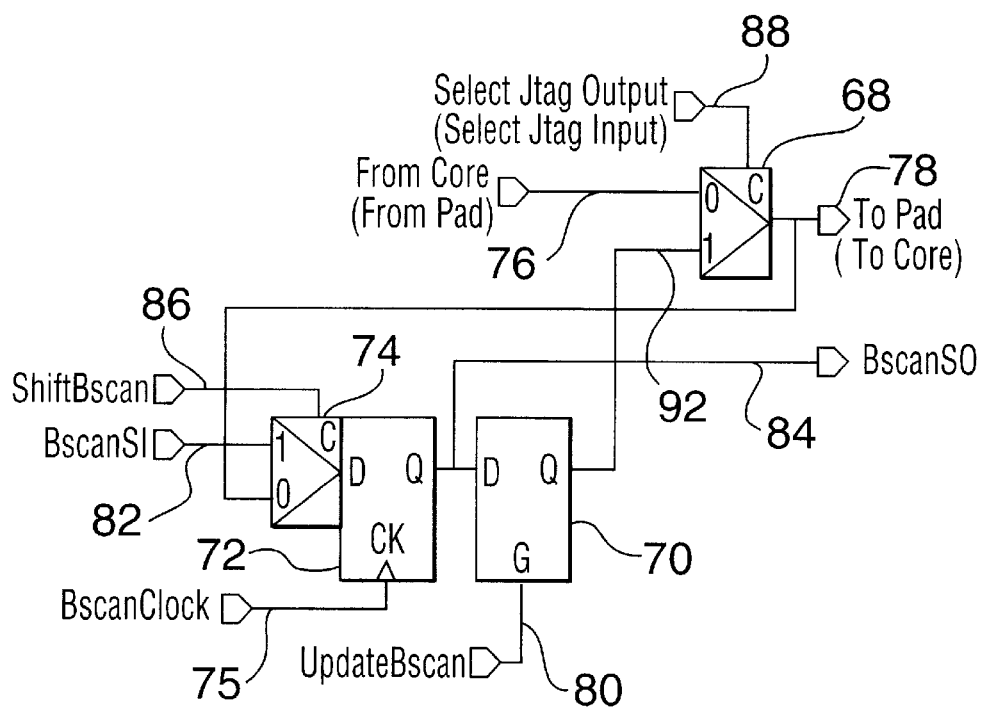
FIG. 4 is a circuit diagram of a standard IEEE 1149.1 boundary scan cell.

FIG. 4 is an electrical schematic of a standard boundary scan cell 28 in accordance with IEEE standard 1149.1. The cell can be used as either an input cell or an output cell as explained below. Cell 28 typically includes a control multiplexer 68, a transparent D-Latch 70, a test register 72 and a multiplexer 74. When used as an output cell, input 76 of multiplexer 68 is connected to the core and output 78 is connected to the pad. These are reversed when the cell is used as an input cell. Test register 72 is controlled by a BscanClock signal 75, which is the Test Clock signal, and receives the output of multiplexer 74. Multiplexer 74 is controlled by a ShiftBscan signal 86 and has two inputs, namely, a BscanSI signal 82 and output 78 of multiplexer 68.

The output of Test Register 72 is connected to a BscanSO output 84 which, in turn, is connected to the BscanSI input 82 of the next boundary scan cell in the scan cell chain and to the input of D-Latch 70. When used as an output cell, the output of the Test Register is output through D-Latch 70 when an UpdateBscan signal 80 is high. The output of D-Latch 70 is applied to the other input 92 of multiplexer 68 which is controlled by a SelectJTagInput or SelectJTagOutput signal, applied to input 88, which determine whether the cell is used as an input cell or output cell. When used as an input cell, a BscanClock pulse is applied to the clock input of Test Register 72 to output its data to the BscanSO output 84.

During the Shift states of the Test Access Port, the ShiftBscan signal 86 is held high so that data flows from BscanSI 82 to BscanSO 84 through multiplexer 74 and Test Register 72.

Data can either be loaded into test register 72 from the port 76 from either an input pad or from the core logic, or driven from the test register 72 through the output port 78 of the cell to either the core logic or to the output pad. Transparent D-latch 70, controlled by UpdateBscan signal 80, ensures that the signals driven out of the cell in the latter case are held while new data is shifted into the cell using the Test Clock. As is well known to those skilled in the art, transparent D-latch 70 is not required in all cases, but is included in FIG. 4 to simplify the discussion.

If all the components used to construct a circuit have a boundary scan register, then the resulting path through the complete design can be used in two ways: First, to allow the interconnections and logic between the various components to be tested, test data can be shifted into all the boundary scan registers associated with the component output pins and loaded in parallel through the component interconnections into those cells associated with the input pads; and, second, to allow the components on the board to be tested, the boundary scan register can be used as a means of isolating on-chip system logic from stimuli received from surrounding components while an internal self-test is performed. Alternatively, if the boundary scan register is suitably designed, it can permit a limited slow-speed static test of the on-chip system logic since it allows delivery of test data to the component and examination of the test results.

In effect, tests applied using the register can detect many of the faults that in-circuit testers currently address, but without the need for extensive bed-of-nails access. Functionally testing the operation of the complete product can be achieved either by using a functional ATE system or using a system-level self test.

By parallel loading the cells at both the inputs and outputs of a component and shifting out the results, the boundary scan register provides a means of "sampling" the data flowing through a component without interfering with the behaviour of the component or the assembled board. This mode of operation is valuable for design debugging and fault diagnosis since it permits examination of connections not normally accessible to the test system.

The difficulty with the IEEE process described above is that it does not provide a true test of the integrated circuits and interconnections while operating at a system clock speed which is substantially higher than that of the test clock. On the other hand, it is not possible to simply adopt another test method because of the existing automatic test equipment base and the large existing component base which was designed for testing using the IEEE standard. The present invention provides an improved testing method and integrated circuit architecture which permits the concurrent testing of the new integrated circuits and interconnect operating at their designed system speed with conventional IEEE test equipment and components operating at the standard test clock speed.

Figure 5:
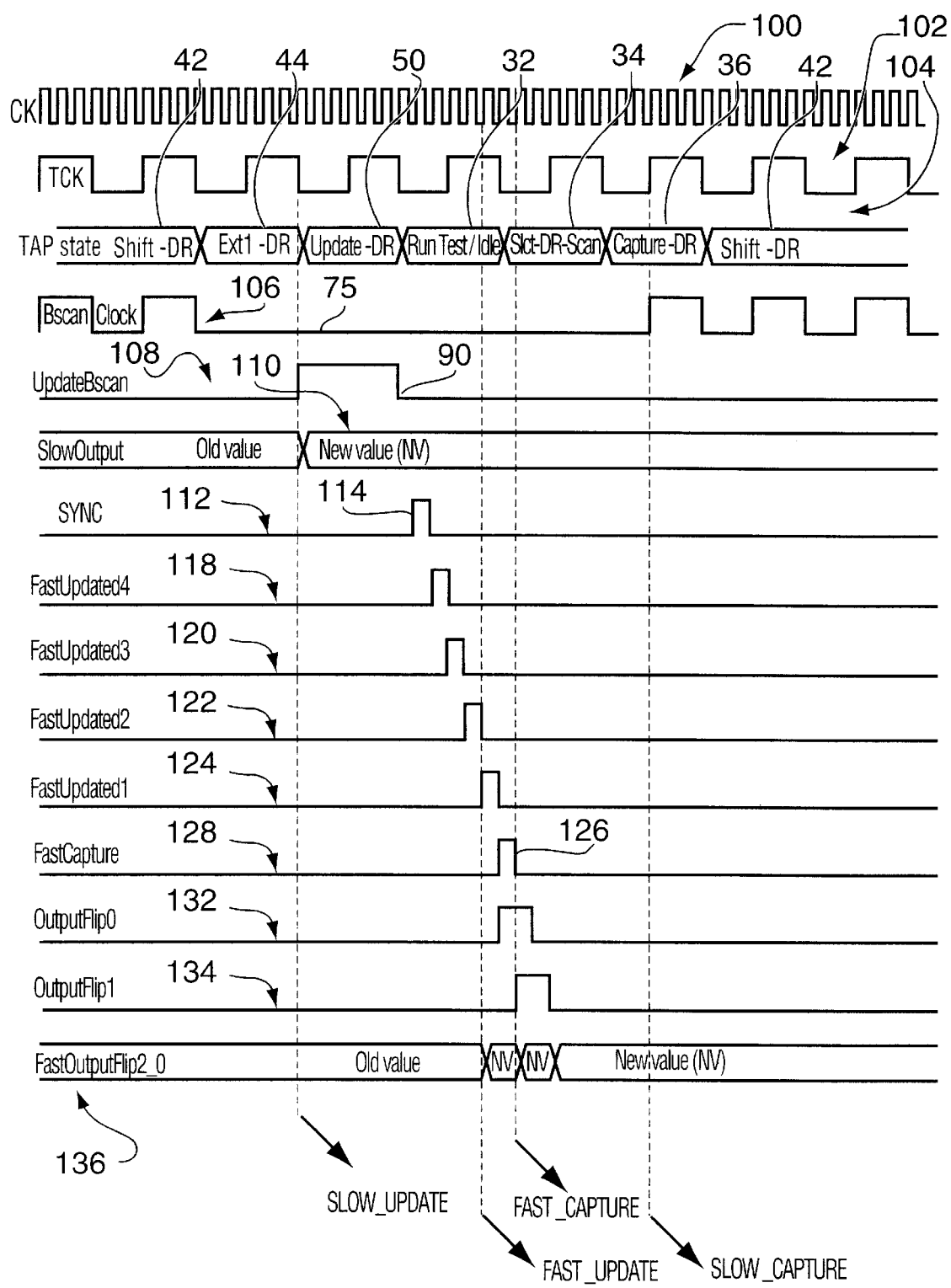
FIG. 5 is a timing diagram illustrating the timing of various signals including the standard test clock signal, the system clock signal at which the core logic of the integrated signals operate, the standard Update signal, and a number of special signals according to preferred embodiments of the present invention, including a Sync signal, FastUpdate signals, a FastCapture signal, and a OutputFlip signals.

FIG. 5 is a timing diagram illustrating the system clock signal CK, Test Clock signal TCK, various states and outputs of the Test Access Port 22, and the unique signals generated by Test Controller 26 of the present invention which enable test results representing system clock speed operation to be obtained while running the test at the conventional test clock speed. The first waveform 100 in FIG. 5 is the system clock, referred to as SysClock and CK in various drawings. The second waveform 102 is the test clock TCK. The third waveform 104 illustrates various states of the Test Access Port. The fourth waveform 106 illustrates the BscanClock signal 75, which is delivered by the Test Access Port and corresponds to the Test Clock signal until the end of the Shift_DR state where it is suppressed until the Capture_DR state. The BscanClock signal is re-started with the first rising edge of the Test Clock signal during the Capture_DR state, as shown by Slow_Capture in FIG. 5. The fifth waveform 108 illustrates the standard UpdateBscan signal 90 which is output by the Test Access Port about one full Test Clock cycle after the end of the Shift_DR state. The sixth waveform 110 illustrates the data in the boundary scan cells of conventional integrated circuits 14 before and after the UpdateBscan signal.

The remaining waveforms in FIG. 5 illustrate the unique signals generated by test controllers 26 of the present invention. Waveform 112 illustrates a synchronize signal 114 which is generated by the master test controller about three or four system clock cycles following the first rising edge of the Test Clock after the standard UpdateBscan signal 90. This signal is simultaneously distributed to all other integrated circuits 12 operating on the system clock domain of the master test controller. The synchronize signal is followed by at least one FastUpdate signal 116 one system clock cycle after the synchronize signal. The FastUpdate signal is generated by individual Test Controllers 26. In some situations, it may be desirable to delay the FastUpdate signal by more than one system clock signal and, to that end, the present invention provides for a sequence of four FastUpdate signals, FastUpdate4, FastUpdate3, FastUpdate2, and FastUpdate1, illustrated in waveforms 118, 120, 122 and 124, respectively, each separated by one system clock cycle. The FastUpdate signal is followed by a FastCapture signal 126, shown as waveform 128, about four system clock cycles following the synchronize signal. The invention also provides for an OutputFlip signal 130 which causes the data in the boundary scans cells to be inverted and then re-inverted to allow for testing for hold-time violations. Waveforms 132 and 134 illustrate two OutputFlip signal, OutputFlip0 and OutputFlip1. OutputFlip0 occurs concurrently with the FastCapture signal and the OutputFlip1 is delayed by one system clock cycle. The last waveform 136 in FIG. 5 illustrates the data in the boundary scan cells of integrated circuits 12 before and after the FastUpdate2 signal, the FastCapture signal and the OutputFlip0 signal. It will be seen that the data captured by the test is representative of the response of the circuit and glue logic and interconnect operating at system clock speed and not on the basis of the relatively slow Test Clock. These signals do not in any way interfere with the testing of the conventional chips used on the board.

The number of clock cycles of hold time during the output flip is programmable for groups of outputs, and can take any integer value. In practice, it is preferable to limit the number in order to reduce the hardware overhead caused by registering the number of clock cycles. Between zero and three clock cycles will satisfy most applications. One such register would be required for each group of cells using this feature. Note that sequential circuits connected to those outputs supporting the output flip capability might be upset by this procedure. The feature may be turned off if the output response needs to be the same as if the same pattern was applied using the normal IEEE 1149.1 sequence.

While four FastUpdate signal choices are shown in FIG. 5, it will be understood that a smaller or larger number may be provided. The present invention contemplates a programmable number of cycles and a suitable mechanism to select which of a plurality of FastUpdate signals is to be used for a bus for example. Similar comments apply to the number of clock cycles of hold time violation testing (i.e. the Output-Flip instruction).

The same test vectors that had been generated to test the interconnect at low speed can be used for high speed interconnect testing; however, the output response of the boundary scan cells connected to the synchronize signal and the system clock will be different. The other difference is that a variable number (including zero) of additional Run_Test/Idle 32 cycles might be necessary for the high-speed signals to be applied and captured. The number of additional cycles is a function of the frequency ratio of the system clock vs the low speed test clock. It will be noted from FIG. 5 that the FastUpdate, FastCapture and OutputFlip signals and steps, respectively, are issued and performed during the Capture_DR state 36, Run_Test/Idle state 32, and Select_DR_Scan state 34 and terminate prior to the standard Capture_DR state 36 of the Test Access Port 22.

Figure 6:
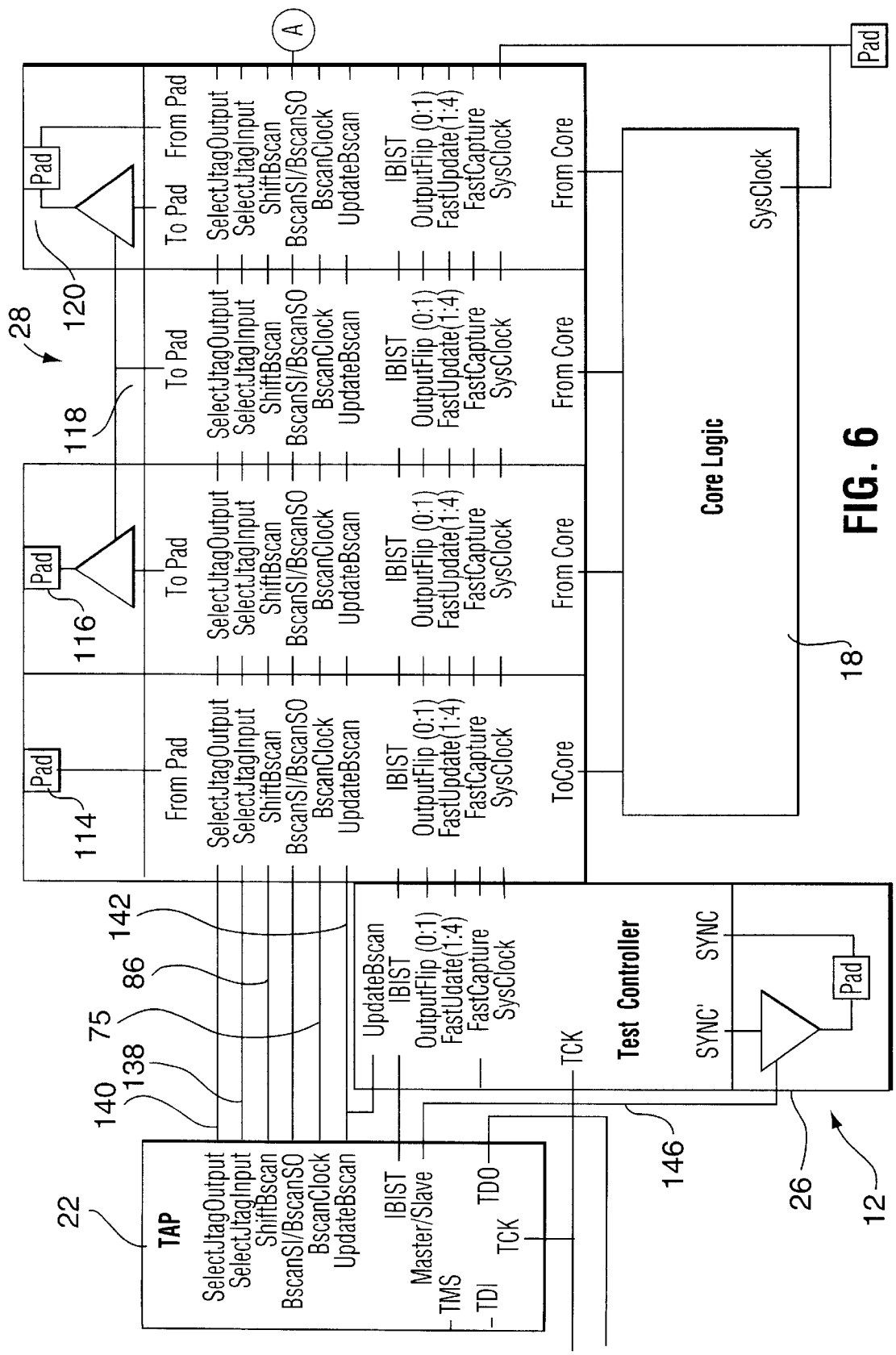
FIG. 6 is a block diagram illustrating the interconnections among a Test Access Port, Test Controller and Boundary Scan Cells of an integrated circuit for high speed interconnect test according to a preferred embodiment of the present invention.

FIG. 6 illustrates in more detail in block diagram form the various components and signals, described above, of an integrated circuit 12 including core 18, Test Access Port 22, Test Controller 26 and four boundary scan cell test register 28. Test register 28 allows one to control and observe all pads, including input pad 114, output pad 116, and bidirectional pad 120 of circuit 12 for test purposes and includes a pad enable cell 118. In real circuits, the number of pads may be considerable. However, the present circuit is sufficient to illustrate the principles involved.

The input boundary scan cells receive data from the external pads of the integrated circuit and pass this data on to the core logic 18. Conversely, the output boundary scan cells receive data from the core logic 18 and pass this data on to the external pads. The Bi-directional boundary scan cells may pass data in either direction. The pad enable boundary scan cell is intended to control the output drivers of the core logic. It is common in the art for output drivers to be tri-state: high and low output levels, plus a high impedance state. The pad enable cell provides a control to force these output drivers into the high impedance state when required. This is done, for example, on startup, to avoid several output drivers on a common bus from conflicting with one another.

The IEEE standard was defined primarily to perform a low-speed interconnect test between integrated circuits on a printed circuit board (PCB) or multi-chip module (MCM)

under the control of the Test Access Port 22 described earlier. The test clock used for the IEEE standard is generally dedicated and unrelated to the system clock(s). The boundary scan cells and Test Controller 26 in the present invention allow a high speed test of the interconnect network between integrated circuits at the next level of packaging of the circuit (i.e. PCB, MCM; etc.). Unlike the prior art, the high speed interconnect test is not limited by the degree of synchronization between the boundary scan cells and integrated circuits.

The circuit illustrated in FIG. 6 has only one system clock CK, but others could be added. In an embodiment having multiple clock domains, each clock domain would require an isolated system of Test Controllers 26, and synchronize signals 114.

The Test Access Port includes the usual Test Data Input TDI, Test Data Output TDO, Test Mode Select TMS, and, of course, the Test Clock signal TCK. Test Access Port 22 includes outputs SelectJtagInput 138, SelectJtagOutput 140, UpdateBscan 142, ShiftBscan 86, BscanClock 75 and BscanSI/BscanSO (on separate pins) to the boundary scan cells as shown; and IBist Signal 144, UpdateBscan, and Master/Slave Mode signal 146 to test controller 26, as shown.

Master/Slave Mode signal 146 determines the mode of the Test Controller as being either a master controller or a slave controller, as explained earlier. In the master mode, the Test Controller is responsive to the UpdateBscan signal by synchronizing the system clock with the test clock, generating synchronize signal 114 and delivering this signal to all other integrated circuits 12, as already mentioned. The synchronization of the two clocks may be achieved by means of an asynchronous interface (not shown) as described and claimed in co-pending U.S. patent application Ser. No. 08/825,446 filed on Mar. 28, 1997, by the assignee of the present invention, which application is incorporated herein by reference. It will be understood that, in a given system clock domain, only one Test Controller 26 will be designated as a master controller; all other Test Controllers are designated as slave controllers. Whether a given Test Controller 26 is in master or slave mode is programmed with the set up instructions from the ATE. All Test controllers, including the master controller and slave controllers, are responsive to synchronize signal 114 by generating the FastUpdate signals, FastCapture signal, and OutputFlip signals and delivering these to the boundary scan cells in proper sequence, according the timing diagram shown in FIG. 5. It will be understood that the plurality of FastUpdate and OutputFlip signals may be generated and delivered to individual boundary scan cells or groups of boundary scan cells in a variety of ways and that the invention is not limited to or by any particular implementation scheme.

Figure 7:
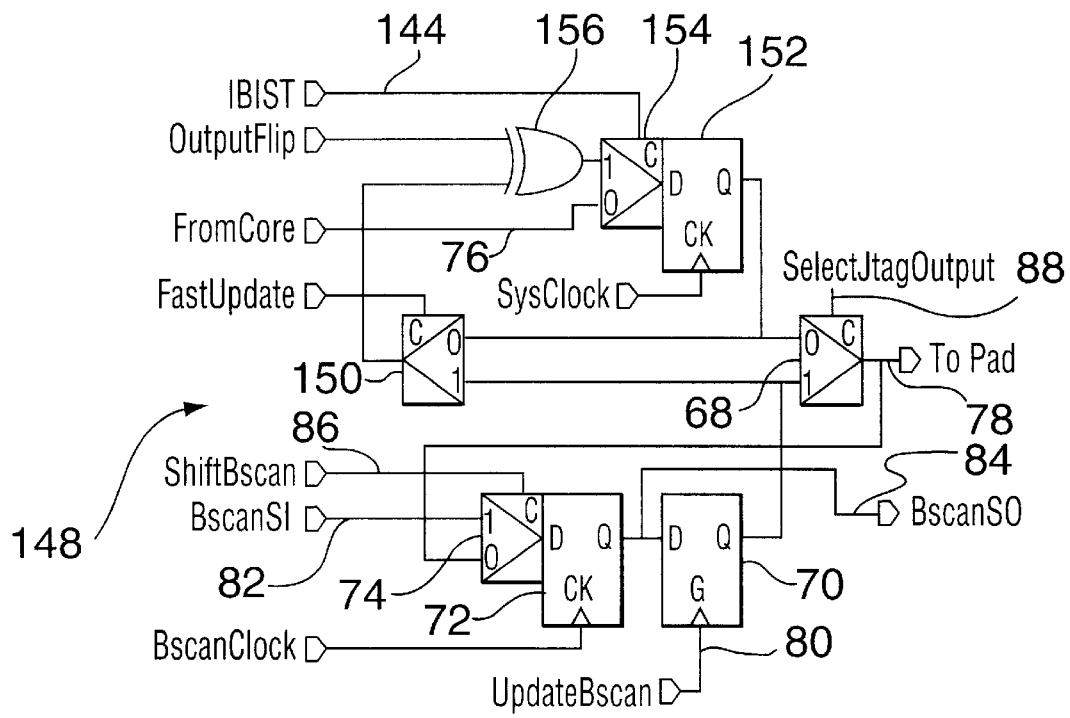
FIG. 7 is a circuit diagram of an output boundary scan cell according to a preferred embodiment of the present invention.
Figure 8:
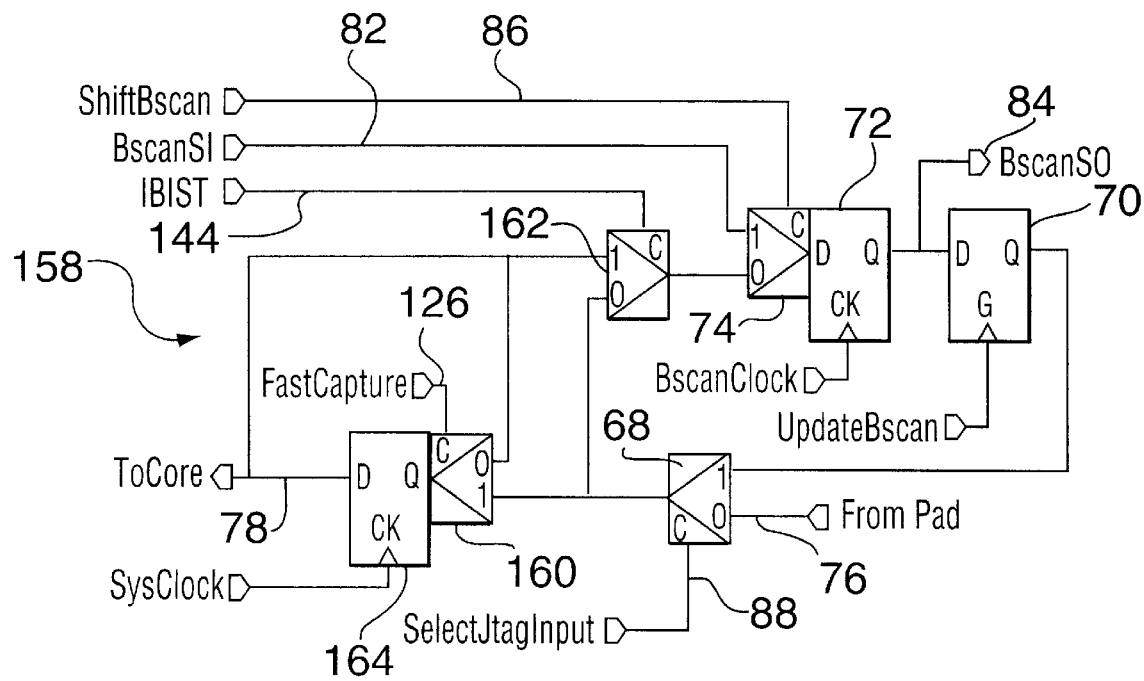
FIG. 8 is a circuit diagram of an input boundary scan cell according to a preferred embodiment of the present invention.
Figure 9:
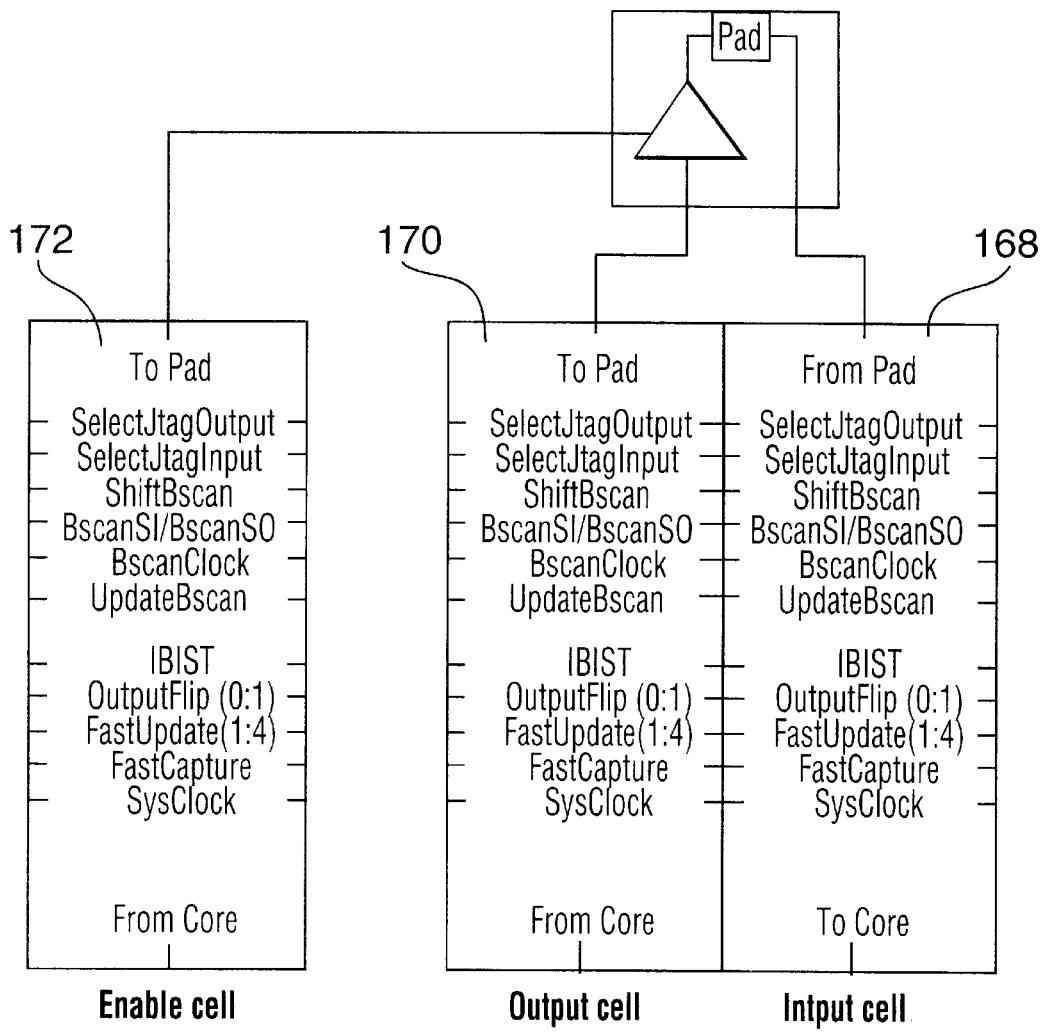
FIG. 9 is a block diagram which schematically illustrates a bidirectional boundary scan cell with an enable cell.

FIGS. 7, 8 and 9 illustrate output, input and bidirectional boundary cells, respectively, which are very similar to the standard boundary scan cell illustrated in FIG. 4, but which are specifically adapted to respond to the unique signals, namely, FastUpdate, FastCapture and OutputFlip, generated by the Test Controller 26 of the present invention. Accordingly, the same reference numerals are used in these figures to designate the same parts as in FIG. 4.

As already indicated in the description of FIG. 4, the general mode of operation of the boundary scan cells is determined by the setting of the SelectJtagInput signal 138 and SelectJtagOutput signal 140 output by Test Access Port 22. The setting of these modes depend on the specific construction of the boundary scan cells, and the features and tests that are required. Because particular settings are not specific to this invention and not required for an understanding and the standard settings are known in the art, they have not been described herein.

Generally speaking, the boundary scan cells must be responsive to the new signals of the invention as described in FIG. 5 while at the same time, being compatible with the specific core logic, and with the test modes that are to be performed. The most common design variations are outlined later.

Specifically, in the case of the output cells, pad enable cells and bi-directional cells operating in an output mode, these boundary scan cells must be responsive to the new high speed, and delayed Update signal (FastUpdate) and, optionally, to the signal to invert and re-invert the output of the cell (OutputFlip). The input cells, and bi-directional cells operating in an input mode, incorporate features to respond to the high speed, advanced Capture signal (FastCapture).

These features can be incorporated into a broad range of cell designs as outlined later. The essential aspects of how boundary scan cells must be responsive to these new signals are as follows:

FastUpdate: When a FastUpdate signal is received by a boundary scan cell, it must release to the pad the test data value that has been serially loaded into its test register on the next active edge of the system clock. The Flip-Flop used to release the test data is either a dedicated test register or a functional register which is also used during the test, such as that shown in FIGS. 7–9. The best results are obtained when a functional flip-flop that is used to release data during normal operation of the circuit is used during the high-speed interconnect test. In this respect, the FastUpdate signal performs the same operation as the Update signal in the IEEE 1149.1 standard.

OutputFlip: When the OutputFlip signal goes high, the ToPad outputs of the output cells, and bi-directional cells in an output mode, are inverted from their current state on the next active edge of the system clock. When the OutputFlip signal goes low again, the output signal is re-inverted to its original value. Only the time at which the data is inverted is critical. Re-inversion can occur at any arbitrary time as long as there is sufficient time for the re-inverted data value to propagate to the boundary scan cells performing a slow data capture.

FastCapture: When a FastCapture signal is received by a boundary scan cell, it must sample the data arriving from the pad on the next active edge of the system clock. When FastCapture goes back to inactive (low), the data must be held until it can be shifted out through the Shift Bscan register. Again, in this respect, the signal operates in the same way as the Capture signal in the IEEE 1149.1 standard.

As well, the FastCapture signal is issued at a programmable time, several cycles before serial unloading is to commence. As described in FIG. 4 above, the standard IEEE 1149.1 cells must commence serial unloading on the next test clock cycle following the Capture signal to prevent the data value from being lost. Since the new boundary scan cells will perform a FastCapture several test clock cycles prior to serial loading, the new boundary scan cells must be designed to hold the data value for a number of cycles of the high speed test clock.

FIG. 7 illustrates an output boundary scan cell 148 constructed in accordance with a preferred embodiment of the present invention. Cell 148 is similar to cell 28 illustrated in FIG. 4 in that it includes a controlling multiplexer 68, a transparent D-Latch 70, a test register 72 and a multiplexer 74, all of which function in essentially the same manner when used as an output cell. However, since the BscanClock is disabled between Exit_DR and the Select_DR states of the Test Access Port, the standard UpdateBscan signal does not operate in the conventional manner. Cell 148 provides means for processing a FastUpdate signal in order to perform the update step and means for processing an OutputFlip signal in order the perform the data inversion and re-inversion, as described earlier. These include a multiplexer 150, a Flip-Flop or Register 152, a multiplexer 154 and an exclusive OR gate 156. The FastUpdate signal is applied to the control input of multiplexer 150 which receives the output of register 152 and of D-Latch 70 which signals are also applied to the two inputs of multiplexer 68. The output of multiplexer 150 is connected to one input of OR gate 156 whose other input is the OutputFlip signal. Multiplexer 154 receives the output of Exclusive OR gate 156 and the core and is controlled by the IBIST signal 144. Register 152 receives the output of multiplexer 154 is controlled by the high speed system clock, SysClock.

Thus, it will be seen that when the FastUpdate signal is high, the data in D-Latch 70 is shifted through multiplexer 150, Exclusive OR gate 156, multiplexer 154, Register 152, multiplexer 68 to output port 78 to the Pad. When the OutputFlip signal is high and FastUpdate is low, the data is inverted by Exclusive OR Gate 156 and delivered to multiplexer 154, and output to port 78 to the Pad via Register 152 and multiplexer 68. The data is also fed back to multiplexer 150 and Gate 156 which re-inverts the data and outputs it as just explained.

FIG. 8 illustrates an input boundary scan cell 158 similar to the circuit shown in FIG. 4, except that it provides means for processing the FastCapture signal 126 to effect the Capture operation. That means is in the form of multiplexer 160 which receives the output of controlling multiplexer 68 and which is controlled by the FastCapture signal 126. The output of multiplexer 68 is also applied to an input of multiplexer 162 where it is applied to multiplexer 74 and loaded into input Test Register 72 where it will be retained until the data is next shifted out of the cell via BscanSO output 84. The output of multiplexer 160 is applied to Flip-Flop 164 controlled by the high speed clock, SysClock, and connected to ToCore output 78. The output of Flip-Flop 164 is fed back to the other input of multiplexer 160 and to multiplexer 162.

During high-speed operation, Test Register 164 captures data coming from the pad when FastCapture goes high and holds the captured value until Test Register 72 is loaded with the value during the Capture_DR state and shifted out during the Shift_DR state. Thus, the flow path in this mode is from multiplexer 68, to multiplexer 160, to Register 164, to multiplexer 162, to multiplexer 74 and to Register 72. During low-speed operation, the flow path is from multiplexer 68, to multiplexer 162, multiplexer 74 and Register 72.

FIG. 9 illustrates a bidirectional boundary scan cell 166 having an input cell 168, an output cell 170 and an enable cell 172 which is operative to select the appropriate one of cells 168 and 170. Cells 168 and 170 are essentially the same as the cells illustrated in FIGS. 7 and 8 and, accordingly, it is not believed necessary to repeat the description.

As already mentioned, for each system clock domain, a separate synchronize signal 114 is generated. The same integrated circuit can generate multiple synchronize signals. The high-speed mode of interconnect test can be active for all system clocks at the same time as long as no signal is going from one system clock domain to another. Of course, it is allowed to go in and out of the low speed test clock domain to or from a system clock domain. If signals cross the system clock domain boundaries, the high-speed interconnect test mode can only be activated on a subset of the system clock domain at a time so that the condition is met. One Test Controller 26 is required for each system clock domain.

It will be understood that various modifications and alterations may be made to the present invention without departing from the spirit of the present invention as defined in the appended claims.

We claim:

1. In a method of testing interconnectivity of circuit boards having components operable at a high speed system clock, said method employing IEEE 1149.1 standard test methods in which test data is shifted into and from said components at the rate of a test clock during Shift_In and Shift_Out operations, and having an update operation and a capture operation between said Shift_In and Shift_Out operations, the improvement comprising: executing said update and capture operations at the rate of said system clock.

2. In a method of testing interconnectivity of circuit boards as defined in claim 1, further including the step of performing an output flip operation following said capture operation and prior to said Shift_Out operation.

3. In a method of testing interconnectivity of circuit boards as defined in claim 2, said output flip operation including inverting data output in said Update operation and re-inverting said data.

4. In a method of testing interconnectivity of circuit boards as defined in claim 3, further including performing said output flip operation concurrently with said Capture operation.

5. In a method of testing interconnectivity of circuit boards as defined in claim 3, further including performing said output flip operation one system clock cycle following said Capture operation.

6. In a method of testing interconnectivity of circuit boards as defined in claim 1, further including the step of delaying execution of said Update operation for a predetermined number of system clock cycles following an Update instruction according to said standard test method.

7. In a method of testing interconnectivity of circuit boards as defined in claim 1, further including the step of providing a sequence of Update instructions at one system clock cycle intervals and selectively performing said Update operation according to one of said Update instructions and issuing a Capture instruction one system clock cycle following a last one of said Update instructions in said sequence.

8. In a method of testing interconnectivity of circuit boards as defined in claim 7, further including the step of performing an output flip operation following said capture operation and prior to said Shift_Out operation.

9. In a method of testing interconnectivity of circuit boards having components operable at a high speed system clock, said method employing IEEE 1149.1 standard test methods in which test data is shifted into and from said components at the rate of a test clock during Shift_In and Shift_Out operations, and having an Update operation and a Capture operation between said Shift_In and Shift_Out operations, said components including a first group of components capable of performing said Update and Capture operations at the rate of said Test Clock only and a second group of components capable of performing said Update and Capture operations at said system clock, the improvement comprising:

performing said Shift_In operation in all of said components concurrently at the rate of said Test Clock;

performing said Update and Capture Operations in said first group of components at the rate of said Test Clock; and performing said Update and Capture Operations in said second group of components at the rate of said system Clock.

10. In a method of testing interconnectivity of circuit boards as defined in claim 9, further including the step of performing, in said second group of components, an output flip operation following said capture operation and prior to said Shift_Out operation.

11. In a method of testing interconnectivity of circuit boards as defined in claim 10, said output flip operation including inverting data output in said Update operation and re-inverting said data.

12. In a method of testing interconnectivity of circuit boards as defined in claim 11, further including performing said output flip operation concurrently with said Capture operation.

13. In a method of testing interconnectivity of circuit boards as defined in claim 11, further including performing said output flip operation one system clock cycle following said Capture operation.

14. In a method of testing interconnectivity of circuit boards as defined in claim 9, further including the step of delaying execution of said Update operation in said second group of components for a predetermined number of system clock cycles following an Update instruction according to said standard test method.

15. In a method of testing interconnectivity of circuit boards as defined in claim 9, further including the step of providing a sequence of Update instructions at one system clock cycle intervals and selectively performing said Update operation according to one of said Update instructions and issuing a Capture instruction one system clock cycle following a last one of said Update instructions in said sequence.

16. In a method of testing interconnectivity of circuit boards as defined in claim 9, further including the step of suppressing said Test Clock in said second group of components during said Update and Capture operations.

17. In a method of testing interconnectivity of circuit boards as defined in claim 9, further including the step of synchronizing all of the components in said second group of components prior to executing said Update and Capture operations therein.

18. In a method of testing interconnectivity of circuit boards having at least one component operable at a high speed system clock, said method employing IEEE 1149.1 standard test methods in which test data is shifted into and from said components at the rate of a test clock during Shift_In and Shift_Out operations, and having an Update operation and a Capture operation between said Shift_In and Shift_Out operations, said components including a first group of components capable of performing said Update and Capture operations at the rate of said Test Clock only and a second group of components capable of performing said Update and Capture operations at said system clock, the improvement comprising:

performing said Shift_In and Shift_Out operations in all of said components at the rate of said Test Clock;

Issuing an Update instruction;

Issuing a Capture instruction a predetermined number of Test Clock cycles following said Update instruction;

performing said Update operation in said first group of components in response to said Update instruction at the rate of said Test Clock;

performing said Capture operation in said first group of components in response to said Capture instruction at the rate of said Test Clock;

performing in said second group of components in response to said Update instruction:

synchronizing said system clock with said test clock and delivering a synchronization signal to all components in said second group of components;

performing a FastUpdate operation in said second group of components in response to said synchronization signal at the rate of said system clock a selective number of system clock cycles following said synchronization signal;

performing a FastCapture operation in said second group of components prior to performing said Capture operation in said first group of components, said FastCapture operation being a predetermined number of system clock cycles following said synchronization signal and at the rate of said system clock;

performing an output flip operation concurrently with or following said FastCapture operation and prior to said Shift_Out operation, said output flip operation including inverting data output in said FastUpdate operation and re-inverting said data; and performing said Shift_Out operation in all of said components concurrently at the rate of said Test Clock.

19. A Test Controller for an integrated circuit for testing interconnectivity of components on circuit boards using IEEE 1149.1 standard test method in which test data is shifted into and from said components at the rate of a test clock during Shift_In and Shift_Out operations, and having an update operation and a capture operation between said Shift_In and Shift_Out operations, said circuit be operable at a system clock which is greater than said Test Clock, said test controller comprising:

means responsive to an Update instruction for producing a FastUpdate instruction and a FastCapture instruction and delivering said FastUpdate and FastCapture instructions in predetermined timed sequence to boundary scans cells in said circuit for executing said Update and Capture operations at the rate of said system clock.

20. A Test Controller as defined in claim 19, further including means for synchronizing said system clock with said Test Clock.

21. A Test Controller as defined in claim 19, further including means for producing a sequence of FastUpdate update instructions on successive system clock cycles.

22. A Test Controller as defined in claim 19, further including means for producing and outputting an output flip signal to cause inversion and re-inversion of data output in said FastUpdate operation.

23. A Test Controller as defined in claim 22, said Test Controller outputting said output flip signal concurrently with said FastCapture instruction.

24. A Test Controller as defined in claim 22, said Test Controller outputting said output flip signal one clock cycle after said FastCapture instruction.

25. A Test Controller as defined in claim 19, further including means for producing and outputting a first output flip signal concurrently with said FastCapture instruction and a second output flip signal one system clock cycle following said FastCapture instruction, said first and second output flip signals being operative to cause inversion and re-inversion of data output in said FastUpdate operation.

26. A Test Controller for an integrated circuit for testing interconnectivity of components on circuit boards using IEEE 1149.1 standard test method in which test data is shifted into and from said components at the rate of a test clock during Shift_In and Shift_Out operations, and having an update operation and a capture operation between said Shift_In and Shift_Out operations, said circuit be operable at a system clock which is greater than said Test Clock, said test controller comprising:

means responsive to an Update instruction for synchronizing said system clock with said test clock and producing a synchronization signal and delivering said synchronization signal to corresponding test controllers in other integrated circuits on said board;

means responsive to said synchronization signal for producing a FastUpdate instruction and a FastCapture instruction and delivering said FastUpdate and FastCapture instructions in predetermined timed sequence to boundary scans cells in said circuit for executing said Update and Capture operations at the rate of said system clock;

means responsive to said synchronization signal for producing and outputting an output flip signal to cause inversion and re-inversion of data output in said FastUpdate operation.

27. A Test Controller as defined in claim 26, said means for producing said FastUpdate instruction including means for producing a sequence of FastUpdate update instructions on successive system clock cycles.

28. A Test Controller as defined in claim 26, said Test Controller outputting said output flip signal concurrently with said FastCapture instruction.

29. A Test Controller as defined in claim 26, said Test Controller outputting said output flip signal one clock cycle after said FastCapture instruction.

30. A Test Controller as defined in claim 26, said means for producing said output flip signal including means for producing a first output flip signal concurrently with said FastCapture instruction and a second output flip signal one system clock cycle following said FastCapture instruction, said first and second output flip signals being operative to cause inversion and re-inversion of data output in said FastUpdate operation.

31. An integrated circuit, comprising:

a core operable at said system clock and having a plurality of connections;

boundary scan cells connected to each said connections and arranged in a scan chain interconnecting said connections;

a test access port having inputs for receiving a test clock signal, a Test Mode Select signal; Test Data Input for receiving test data thereat; and outputs for Serial Data, an Update instruction and a Capture instruction;

a Test Controller responsive to said Update instruction for producing a FastUpdate instruction and a FastCapture instruction and delivering said FastUpdate and FastCapture instructions in predetermined timed sequence to said boundary scans cells for executing Update and Capture operations at the rate of said system clock.

32. A integrated circuit as defined in claim 31, said test controller further including means responsive to said Update instruction for synchronizing said system clock with said Test Clock.

33. An integrated circuit as defined in claim 31, said means for producing said FastUpdate instruction further including means for producing a sequence of FastUpdate update instructions on successive system clock cycles.

34. An integrated circuit as defined in claim 31, said test controller further including means for producing and outputting an output flip signal to cause inversion and re-inversion of data output in said FastUpdate operation.

35. An integrated circuit as defined in claim 34, said means for producing and outputting said output flip signal being operable to output said output flip signal concurrently with said FastCapture instruction.

36. An integrated circuit as defined in claim 34, said means for producing and outputting said output flip signal being operable outputting said output flip signal one clock cycle after said FastCapture instruction.

37. An integrated circuit as defined in claim 31, further including means for producing and outputting said output flip signal being operable to produce a first output flip signal concurrently with said FastCapture instruction and a second output flip signal one system clock cycle following said FastCapture instruction, said first and second output flip signals being operative to cause inversion and re-inversion of data output in said FastUpdate operation.

38. An integrated circuit as defined in claim 31, said test controller being operable in a master controller mode and a slave controller mode, said test access port being operable to output master/slave controller mode signal representative of a master controller mode or a slave controller mode, said test controller being responsive to a master/slave controller mode signal representative of a master controller mode by synchronizing said system clock with said test clock and outputting a synchronizing signal, said test controller being responsive to a said synchronization by outputting said FastUpdate and said FastCapture instructions.

39. An integrated circuit as defined in claim 31, said boundary scan cells being operable at the rate of said test clock during Shift_In and Shift_Out states of said test access port and being operable at the rate of said system clock in states of said test access ports between said Shift_In and Shift_Out states.

40. An integrated circuit as defined in claim 39, said boundary scan cells including a register for storing test data captured during said update operation until said test data is shifted out during a Shift_Out operation.

41. A boundary scan cell for inputting and/or outputting data to the core of an integrated circuit having a test access port and a test controller and operable at a system clock, said test access port having a data Shift_In state for shifting data into said circuit, a data Shift_Out state for shifting data captured from said core from said circuit, an Update state for effecting an Update operation and a Capture state for effecting a Capture operation, said boundary scan cell comprising:

means operable at a test clock rate for receiving data during said Shift_In state and outputting data during said Shift_Out state; and means operable at said system clock rate and responsive to a FastUpdate signal output by said test controller for performing an Update operation; and means operable at said system clock rate and responsive to a FastCapture signal output by said test controller for performing a Capture operation.

42. A boundary scan cell, as defined in claim 41, further including means responsive to an output flip signal for inverting and re-inverting data output in said update operation prior to said Shift_Out operation.

43. An integrated circuit as defined in claim 41, said boundary scan cell including a register for storing test data captured during said update operation until said test data is shifted out during a Shift_Out operation.

* * * * *